United States Patent [19]
Kato et al.

[11] Patent Number: 5,460,571
[45] Date of Patent: Oct. 24, 1995

[54] ELECTRO-MAGNETICALLY SHIELDED VENTILATION SYSTEM

[76] Inventors: Junichi Kato, 1631 Kalispell Ct., Sunnyvale, Calif. 94087; Jon A. Yenick, 599 Fenton St., San Jose, Calif. 95127

[21] Appl. No.: 332,541

[22] Filed: Oct. 31, 1994

[51] Int. Cl.⁶ .............................. H05K 7/20; H05K 9/00
[52] U.S. Cl. .......................... 454/184; 361/695; 361/818
[58] Field of Search .................................... 361/693, 695, 361/818; 454/184, 276

[56] References Cited

U.S. PATENT DOCUMENTS

| | | | |
|---|---|---|---|
| 3,546,359 | 12/1970 | Ciccarelli | 454/184 X |
| 4,383,286 | 5/1983 | Hicks | 361/695 |
| 4,517,880 | 5/1985 | Buckner et al. | 454/184 |
| 4,702,154 | 10/1987 | Dodson | 454/184 |
| 4,724,747 | 2/1988 | Sturm et al. | 454/184 |
| 4,751,872 | 6/1988 | Lawson, Jr. | 454/184 |
| 5,134,547 | 7/1992 | Takamizawa | 36/818 |
| 5,288,203 | 2/1994 | Thomson | 415/178 |

FOREIGN PATENT DOCUMENTS

| | | | |
|---|---|---|---|
| 695409 | 12/1930 | France. | |
| 5-121886 | 5/1993 | Japan. | |
| 152776 | 6/1993 | Japan | 361/695 |

OTHER PUBLICATIONS

D. H. Kekas, et al., "Snap–Together Cooling Fan Assembly", *IBM Technical Disclosure Bulletin*, IBM Corp., vol. 22, No. 6, Nov. 1979, pp. 2391 and 2392.

*Primary Examiner*—Harold Joyce

[57] ABSTRACT

An electro-magnetically shielded fan grill for use in venting air to a metallic cabinet. The fan grill has a multitude of arcuately-shaped trapezoidal vent apertures formed in one of the side panels of the cabinet. The vent apertures are optimally arranged in a plurality of concentric circular rows. Each aperture is substantially the same size and shape as every other aperture in the same row. Each aperture and each row of apertures is spaced apart so that the minimum distance between each aperture is substantially the same for all apertures in all rows. The size of each aperture is designed so that the longest chord of any arc segment is made less than $\lambda/10$ which $\lambda$ is the wavelength of the highest frequency signal to be contained within the enclosure. At least a single row of aperture vents near the outside perimeter of the grill is inclined outwardly from the plane of the side panel at an angle $\alpha_o$ so as to displace the plane of those apertures in the center section of the grill. The central portion of the fan grill is thus extended outwardly, so that a fan housing can be connected directly to the interior face of the side panel, without excessive air turbulence. In an alternate embodiment, all of the apertures are bowed outwardly so that a fan housing can be connected directly to the interior face of the side panel, without excessive air turbulence.

14 Claims, 5 Drawing Sheets

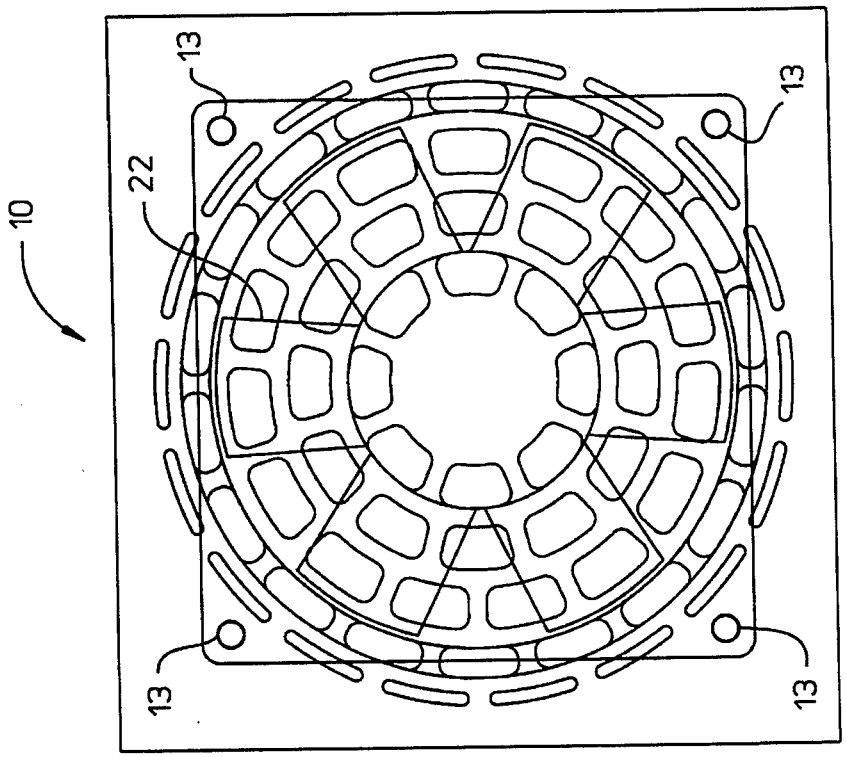
FIG. 2
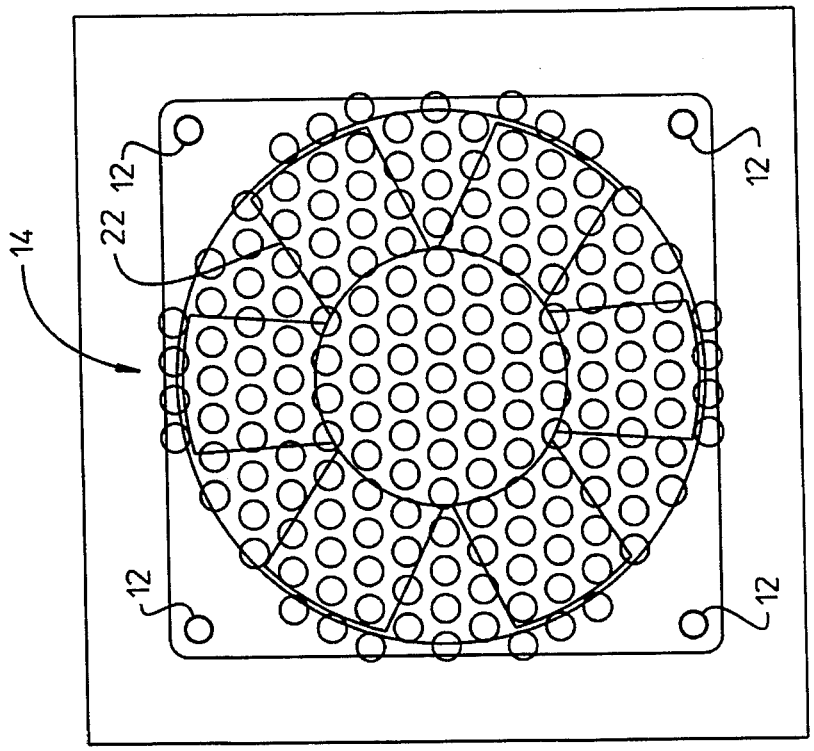
(PRIOR ART) FIG. 1

ELECTRO-MAGNETICALLY SHIELDED VENTILATION SYSTEM

BACKGROUND OF THE INVENTION

This invention pertains generally to ventilation systems designed for use with electronic equipment, such as personal computers, servers, etc., and more particularly, to a novel electro-magnetically shielded ventilator grill for use in connection with forced air ventilation systems.

As the operational speeds of computers and computer circuits have increased over the years, so has the emitted electro-magnetic (EM) radiation of components used in such computers and circuits. Increased levels of EM radiation are to be expected with higher frequency signals. At frequencies below a few 100 kHz component leads of a few millimeters act as simple conductors, yet at frequencies above 50 MHz the same conductors can become antennas radiating EM energy in all directions. EM radiation is an inherent problem in designing high speed digital circuits. Stray radiation causes electro-magnetic interference (EMI) in surrounding electronic systems which often causes abnormalities to occur in those systems. Accordingly, numerous EM emission standards have been established by governmental regulatory agencies setting limits on the amount of radiated and conducted energy from electronic systems. Such standards vary depending upon the type of electronic system, the environment of use and various other factors. (For example, the subject apparatus described herein is designed to meet the emission standards of the 1993 FCC class B requirements for unintentional radiators, Title 47 part 15, and CISPR 22, level B requirements.)

It is well known that if the source of EM radiation cannot be eliminated or removed from close proximity to other electronic parts that may act as receptors, the only sure way to prevent the unwanted electro-magnetic interference is by shielding the radiator, the receptor or both. Basically EM shielding suppresses the radiated energy by covering the radiator/receptor with an electrically conductive material. In the case of a computer system, the shielding takes the form of a closed metallic cabinet (a chassis) which houses and provides mechanical support for the computer circuit boards.

Forced air ventilators are particularly a problem for shielded enclosures, since fan grill openings offer unusually large leakage paths to radio frequency signals. Eliminating the fan grill and the entire ventilation system is one solution to containing emissions, albeit impractical, but nearly every computer system from a common personal computer (pc) to a large mainframe computer requires some form of ventilation system to exhaust excess heat. The traditional wire finger guard covering a fan blade aperture provides ample air flow but virtually no resistance to EM signals. Conversely, simple circular hole patterns punched into a chassis (see FIG. 1) have been used with success to limit radiation, but the volume of air flow is not optimum, and the small apertures create enough back pressure to require a plenum interfacing the grill and the fan blades to reduce air turbulence at the interface of the grill and the fan blades. In some cases the air flow is so poor that multiple ventilator systems have been required (see, for example, U.S. Pat. No. 4,751,872).

Accordingly, this invention is directed to an inexpensive EM shielded fan grill design particularly useful when used in combination with metallic cabinets for electronic equipment.

A principal object of this invention is the provision of a simple fan grill that provides EM shielding and increased air flow over previous ventilator designs.

SUMMARY OF THE INVENTION

In accordance with the teachings of the present invention, these and other objectives are achieved through a novel EM shielded fan grill for use in venting a metallic cabinet. The fan grill has a multitude of arcuately-shaped trapezoidal vent apertures foraged in one of the side panels of the cabinet and are arranged in a plurality of concentric circular rows. Each vent aperture is substantially the same size and shape as every other aperture in the same row. Each aperture and each row of apertures is spaced apart so that the minimum distance between each aperture is substantially the same for all apertures in all rows. At least one row of apertures near the outside edge of the grill is inclined outwardly from the plane of the side panel at an acute angle $\alpha_o$ so as to displace the plane of those apertures in the center section of the grill. The central portion of the fan grill is thus extended outwardly to create a gap or deadspace between the fan blades and the grill face, so that a fan housing can be connected directly to the interior face of the side panel without excessive air turbulence. In an alternate embodiment, all of the apertures are bowed outwardly so that a fan housing can be connected directly to the interior face of the side panel, without excessive air turbulence.

BRIEF DESCRIPTION OF THE DRAWINGS

For a better understanding of the invention as well as other objects and further features thereof, reference is made to the accompanying drawings wherein:

FIG. 1 is a plan view of a prior art design fan grill having a circular hole pattern with the outline of a typical fan superimposed on top of the fan grill;

FIG. 2 is a plan view of a fan grill which embodies the present invention with the outline of a typical fan superimposed on top of the grill;

DETAILED DESCRIPTION

For a better understanding of the subject invention, reference is made to the following description and to the above-described drawings. FIG. 1 and FIG. 2 are provided to illustrate the obvious differences between the prior art shielded fan grill and the preferred embodiment of the subject invention. FIG. 1 depicts the front view of a prior art design fan grill 14 having a circular hole pattern with the outline 22 of a typical fan superimposed on top of the fan grill. With previous designs the fan housing/bracket and a plenum would be attached to the interior (behind as shown) the fan grill using suitable mounting screws connected through the four screw bores 12. FIG. 2 depicts an equivalent front view of a fan grill 10 which embodies the present invention with the outline 22 of the same typical fan superimposed on top of the grill. Fan grill 10 is designed to optimize, among other features, the amount of air flow through the grill (which is in direct proportion to the area of the vent apertures). For example the approximate vent opening area of the grill shown in FIG. 2 is calculated to be over 25% greater than the vent opening area of the grill shown in FIG. 1. It should be noted that although slightly larger circularly shaped apertures would have provided an increase in air flow while also providing the desired EM radiation containment, the flow of air would not be optimum, and the apertures would not have passed the so-called "finger guard" mechanical safety hazard requirement (i.e., UL 1950, CSA 950 and IEC 950).

Figure 4:
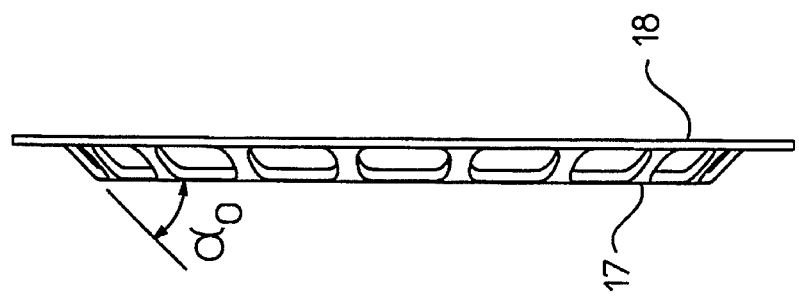
FIG. 4 is a side view of the fan grill depicted in FIG. 3.
Figure 3:
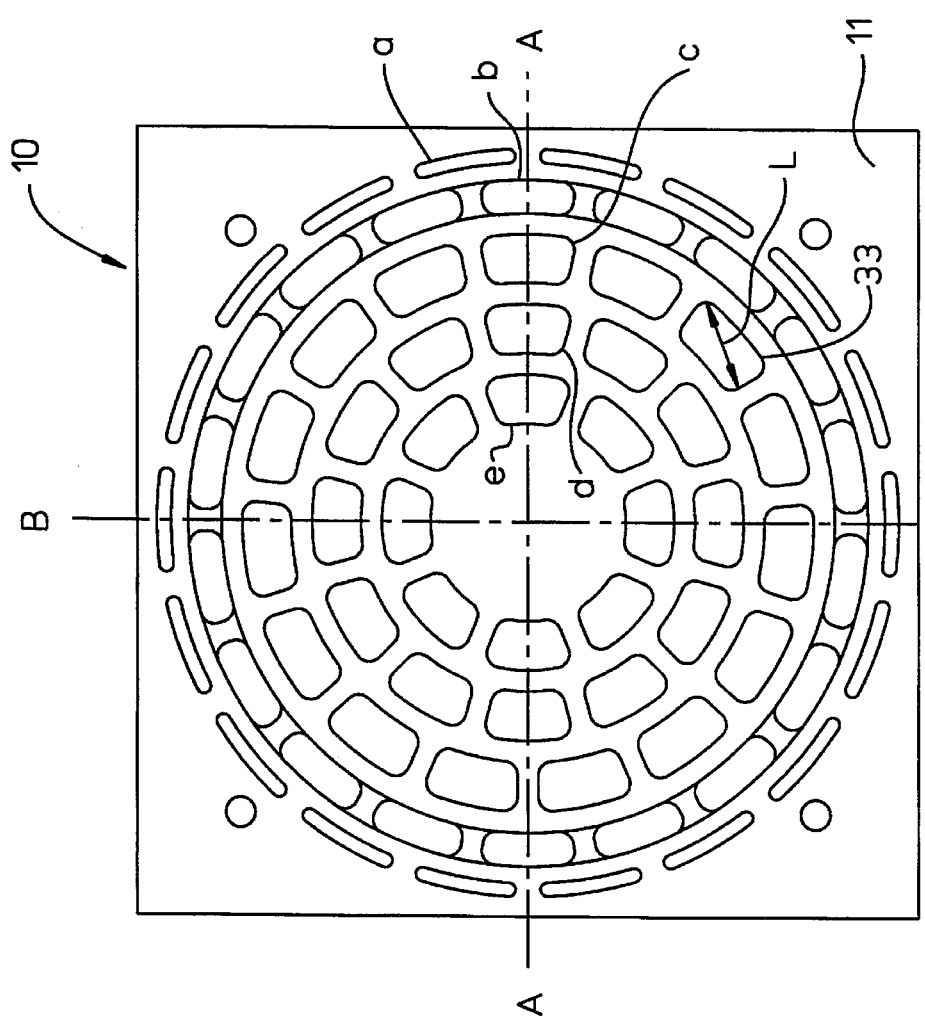
FIG. 3 is a detailed plan view of a fan grill which embodies the present invention.
Figure 5A:
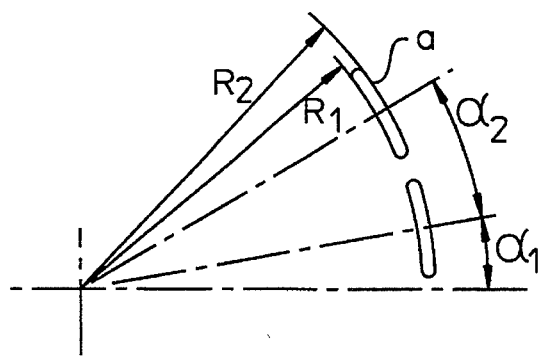
FIGS. 5a–5e are partial views of the vent apertures in each row of the fan grill depicted in FIG. 3.
Figure 5B:
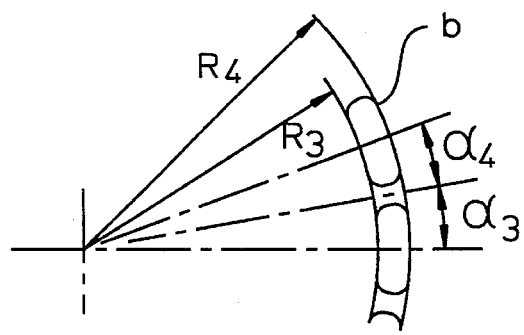
Figure 5C:
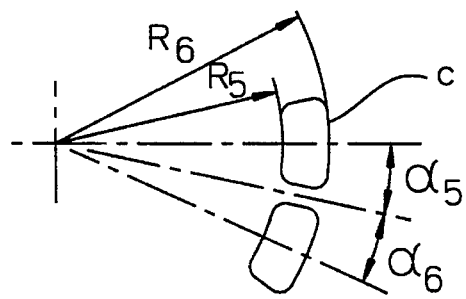
Figure 5D:
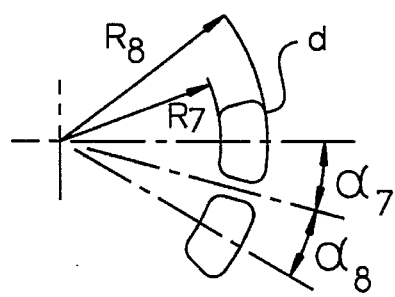
Figure 5E:
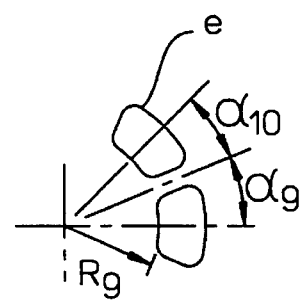

FIG. 3 and FIG. 4 illustrate a shielded fan grill 10 that embodies the present invention. Typically such an array of vent apertures would be punched or machined into the side panel of a metallic cabinet used for any number of electronic systems. (Although the term "side panel" suggests a "side," the specific term is intended to mean any exterior surface of such an enclosed cabinet including the top, bottom or front panel.) Grill 10 comprises an array of 5 rows of apertures carefully arranged into concentric circular rows. Center lines AA and BB are also shown as reference points. Each row of apertures is designated with a letter a, b, c, d, or e starting with the outermost row and moving to the innermost row. Although only 5 rows are shown in FIG. 3, the concept described herein is applicable to any number of rows (>1) and any number of aperture vents. Each aperture vent is an arcuately-shaped trapezoidal slot having rounded corners. (More precisely each aperture vent is in the shape of a segment of a circle with rounded corners.) In general there are a number of variables affecting the desired size and shape of the apertures in each row. The most important variable is referred to herein as the dimension L, which is the longest which is the longest linear dimension in any aperture vent. In FIG. 3 L is shown for aperture 33 as a diagonal line. Specifically, the size and shape of each aperture vent are carefully designed not to exceed the predetermined dimension L, which is related to the highest frequency signal to be contained within the shielded enclosure. In addition the size and shape are also selected so that the individual apertures fit evenly in a circular pattern of rows as is shown in FIG. 3. The minimum separation between each aperture and between each row of apertures is selected based upon a stress analysis of the pattern selected. In general the minimum separation between each row need not be the same or be equal to the separation between aperture vents in the same row; however, in the preferred embodiment and for optimum air flow, the separation is preferably the same for aperture vents in the same row and between different rows. For the particular pattern shown and for 18 gauge (1.22 mm) tempered sheet steel, 3 mm was used as the minimum desired separation. Care must be taken in designing the aperture sizes, since as the overall size of the apertures decreases, the ratio of interconnecting metal to open space increases, and accordingly the amount of air that may be vented through the apertures is reduced. In other words, the size of each aperture should be designed as large as possible consistent with the lowest frequency signal to be contained, i.e., the highest containment frequency limits the size of the vent aperture.

FIG. 4 illustrates that row b of aperture vents is intentionally inclined at an acute angle $\alpha_o$ from the plane of the side panel 11. The effect of inclining a single row of apertures as shown is to create a separation between rows c-e and the plane of the side panel 11. For the particular embodiment shown, rows c-e are separated approximately 6.0 mm from the plane of side panel 11, and $\alpha_o$ is 45°. The purpose of the displacement is to create an added separation between surface 18 and surface 17 so that the fan housing can be attached directly to surface 18 without the need for a plenum. With this purpose in mind, the selection of which row to incline, row b in the embodiment shown in FIG. 3, depends upon the diameter of the fan blade to be used in conjunction with the aperture vents. The diameter of the fan blade should be no wider than the diameter of the offset row(s) of apertures, otherwise the dead space between the fan blades and the plane of the offset vent apertures looses its desired effect. In the example depicted in FIG. 3, the outside diameter of row c must be at least as wide as the fan blade diameter for proper operation of the ventilation system.

Referring to FIGS. 5a–5e, the specification of the aperture sizes and placement are completely defined by the radii and arc's defined therein. For the example shown the following dimensions (in mm) and angles apply.

| n | $R_n$ | $\alpha_n$ |
| --- | --- | --- |
| 1 | 51.2 | 10.0° |
| 2 | 53.2 | 20.0° |
| 3 | 44.0 | 10.0° |
| 4 | 48.8 | 10.0° |
| 5 | 34.0 | 12.0° |
| 6 | 41.0 | 12.0° |
| 7 | 24.0 | 15.0° |
| 8 | 31.0 | 15.0° |
| 9 | 14.0 | 22.5° |
| 10 | 21.0 | 22.5° |

Additionally, the radius of the rounded corners of each aperture vent was chosen to be 2 mm.

FIG. 3 also indicates that the outside row "a" of apertures vents is more elongated than the apertures vents in the other rows. The reason for this is that their purpose is to weaken the metal in the vicinity of the outside perimeter of row b to facilitate bending the metal $\alpha_o$ degrees from the plane of the side panel 11 (or 45° in the preferred embodiment). However, as is also true of the other aperture vents, those apertures in row "a" must also be less than the predetermined length dimension L.

The selection of L, as is indicated above, is determined by the highest frequency signal which is to be contained within the shielded cabinet. As a general of antenna rule, a length of wire ceases to be an effective EM radiator for wire lengths under $\lambda/10$, where $\lambda$ is the wavelength of the signal being radiated. A corollary of this rule is that if the length of an opening in a shielded enclosure is $\leq \lambda/10$, then signals having a wavelength greater than $\lambda$ will be effectively contained within the enclosure. Applying this rule to aperture vents in any ventilation system, for EM containment for frequencies up to 2 GHz, any opening must be less than 15 mm in length. For the embodiment shown in FIG. 3 where the aspect ratios (length to width) of the aperture vents are greater than 2:1, L (which is, as was stated above, the longest linear dimension of any aperture) is designed to be less than 15 mm for the effective containment of signals under 2 GHz in frequency. The dimensions provided in the above table reflect this linear constraint.

Figure 6:
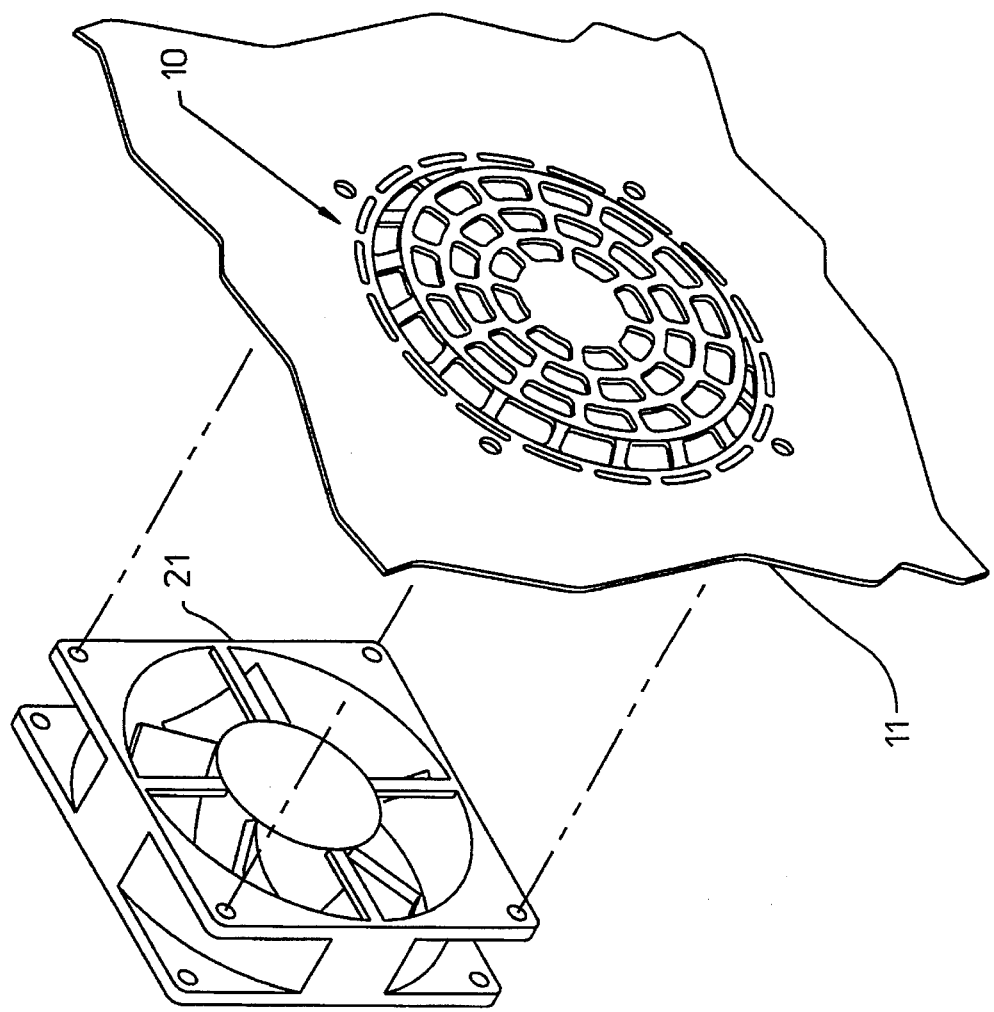
FIG. 6 is an exploded view of a section of a metallic cabinet having a fan grill which embodies the present invention.

Referring to FIG. 6, the preferred embodiment 10 is shown in perspective in relation to the fan housing 21 as it would be attached directly to side panel 11.

Figure 7:
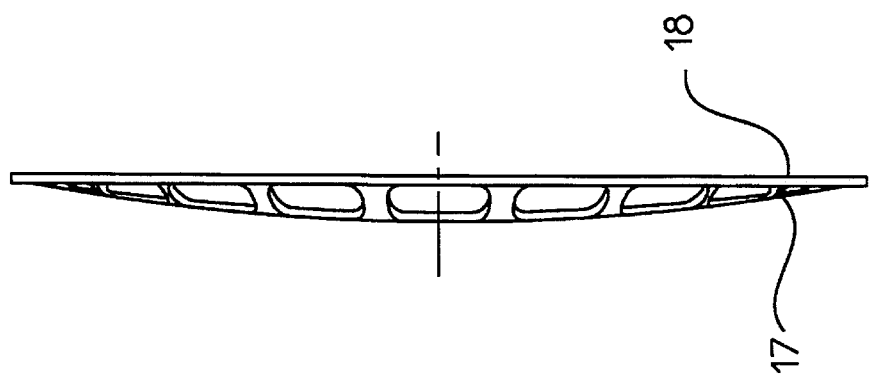
FIG. 7 is a side view of an alternate embodiment of the fan grill illustrated in FIG. 3.

It will be apparent to those skilled in the art that many modifications and changes may be made and still be within the spirit of the present invention. As was stated above the number of rows of aperture vents is dependent upon the size of the individual aperture vents and the overall opening desired, i.e., the diameter of the fan blade used in conjunction therewith. In addition, although row b is shown in FIG. 3 to be inclined to create the desired offset shown, certainly 2 or more such rows of aperture vents could be inclined to increase the amount of offset. This added separation between the fan blades and the inside face 17 of aperture vents may be beneficial for increased fan speeds. Alternatively, such inclination could be made to include all aperture vents inside row "a" so as to give the grill a conical or even a bowed appearance. Such a bowed or semi-elliptical shaped surface is depicted in FIG. 7. Some initial accommodation of the apertures would probably be needed, at least for the conical shape, since stretching the entire surface would distort the width parameter of the preformed apertures.

Another modification that could be made within the spirit of the present invention is to eliminate the outside row "a" of aperture vents. For certain applications it may not be necessary to weaken the metal to facilitate bending the side panel 11, e.g., the type of metal may be very pliable or simply very thin.

A further modification that could be made to the preferred embodiment as shown in FIGS. 2 and 3. The particular pattern shown has no center aperture at the intersection of centerlines AA and BB. For a close spacing between the fan blades and the surface 17 of the grill, a center aperture does not contribute to the air flow through the entire grill due to the placement of the fan motor. However, for wider spacings between the fan blades and the surface 17 of the grill, a center aperture or group of apertures would contribute to the overall air flow and would be beneficial. Any center aperture would still be limited in maximum dimension L as are the other apertures.

Accordingly, the disclosure of the present invention is intended to be illustrative, but not limiting, of the scope of the invention, which is set forth in the following claims.

What is claimed is:

1. An EM shielded fan grill for use in venting a metallic cabinet having a plurality of planar side panels, said fan grill comprising:
    a multitude of arcuately-shaped trapezoidal apertures formed in one of said side panels and arranged in a plurality of concentric circular rows;
    each aperture being substantially the same size and shape as every other aperture in the same circular row, and characterized by a parameter L equal to the length of the longest linear dimension of an aperture, said parameter being a function of the wavelength of the highest frequency signal being contained by said fan grill;
    each aperture being spaced apart so that the distance between each aperture is the same for all apertures in the same rows; and
    at least one of said circular rows being inclined at an angle $\alpha_o$ outwardly from the plane of said side panel so as to outwardly displace those apertures having row diameters less than said inclined row of apertures.

2. An EM shielded fan grill as defined in claim 1 wherein said at least one row of vent openings is adjacent to the outermost row.

3. An EM shielded fan grill as defined in claim 2 wherein each aperture is spaced apart so that the separation between each aperture is the same for all apertures in all rows.

4. An EM shielded fan grill as defined in claim 3 wherein said plurality of concentric circular rows is 5.

5. An EM shielded fan grill as defined in claim 4 wherein said parameter L further comprises a number $\leq \lambda/10$, where $\lambda$ is the wavelength of the highest frequency signal to be contained within said metallic cabinet.

6. An EM shielded fan grill as defined in claim 5 wherein said $\alpha_o=45°$.

7. An EM shielded fan grill as defined in claim 6 wherein said apertures have rounded corners.

8. An EM shielded fan grill as defined in claim 7 wherein said at least one of said circular rows being inclined is one.

9. An EM shielded fan grill as defined in claim 8 wherein said apertures are formed from said side panel by stamping a section of said one side panel prior to forming said one inclined row.

10. An EM shielded ventilation system for use in venting a metallic cabinet having a plurality of planar side panels, said system comprising:
    a fan device having a plurality of fan blades formed around a central axis, said fan blades defining an outer diameter D, and said fan device being secured to one of said planar side panels; and
    a fan grill formed in said one side panel to permit air flow therethrough, said fan grill comprising:
    a multitude of arcuately-shaped trapezoidal apertures formed in said one of said side panels and arranged in a plurality of concentric circular rows centered about said central axis, said circular rows extending to at least an outer diameter D;
    each aperture being substantially the same size and shape as every other aperture in the same circular row, and characterized by a parameter L equal to the length of the longest chord of any arc segment of any aperture, said parameter being a function of the wavelength of the highest frequency signal being contained by said fan grill;
    each aperture being spaced apart so that the distance between each aperture is the same for all apertures in the same rows; and
    said circular rows being bowed outwardly from the plane of said side panel.

11. An EM shielded ventilation system as defined in claim 10 wherein each aperture is spaced apart so that the separation between each aperture is the same for all apertures in all rows.

12. An EM shielded ventilation system as defined in claim 11 wherein said plurality of concentric circular rows is 5.

13. An EM shielded ventilation system as defined in claim 12 wherein said parameter L further comprises a number $\leq \lambda/10$, where $\lambda$ is the wavelength of the highest frequency signal to be contained within said metallic cabinet.

14. An EM shielded ventilation system as defined in claim 13 wherein said apertures have rounded corners.

* * * * *